United States Patent [19]
Sawada

[11] Patent Number: 6,133,099
[45] Date of Patent: Oct. 17, 2000

[54] VERTICAL MOSFET AND METHOD OF MANUFACTURING THEREOF

[75] Inventor: Masami Sawada, Tokyo, Japan

[73] Assignee: NEC Corporation, Tokyo, Japan

[21] Appl. No.: 09/018,441

[22] Filed: Feb. 4, 1997

[30] Foreign Application Priority Data

Feb. 4, 1997 [JP] Japan .................................. 9-021612

[51] Int. Cl.$^7$ .................................................. H01L 21/336
[52] U.S. Cl. ............................................ 438/270; 438/589
[58] Field of Search ..................................... 438/589, 268, 438/270, 272

[56] References Cited

U.S. PATENT DOCUMENTS

| | | |
|---|---|---|
| 5,151,381 | 9/1992 | Liu et al. . |
| 5,399,515 | 3/1995 | Davis et al. . |
| 5,460,985 | 10/1995 | Tokura et al. . |
| 5,672,524 | 9/1997 | Liu et al. . |
| 5,763,310 | 6/1998 | Gardner ................................. 438/270 |
| 5,858,866 | 1/1999 | Berry et al. ............................ 438/589 |

FOREIGN PATENT DOCUMENTS 7-321319  12/1995  Japan .

OTHER PUBLICATIONS

Tokura et al., "The DMOS Consisting of Channel Region Defined by LOCOS (LOCOS–DMOS): A New Process/ . . . MOSFET", 5th International Symposium on Power Semiconductor Devices and ICs, 1993, pp. 135–140.

*Primary Examiner*—Richard Booth
*Attorney, Agent, or Firm*—Sughrue, Mion, Zinn, Macpeak & Seas, PLLC

[57] ABSTRACT

A vertical MOSFET of the present invention comprises a semiconductor wafer having a groove selectively etching in the semiconductor wafer to have substantially vertical side walls. The groove is oxidized using local oxidation of silicon (LOCOS) at 1100° C. or greater to form a LOCOS film on the semiconductor wafer in the groove so that a whole side surface of said semiconductor wafer exposed by the groove is substantially vertical and essentially flat. The LOCOS film in the groove is removed and a thermal insulating film on the semiconductor wafer in the groove. Then a gate electrode made of a conductive film is formed on the thermal insulating film. An interlayer insulating film is formed on the gate electrode and a source electrode is formed in ohmic contact with a source region and a base region. A drain electrode is connected to the opposite side of the semiconductor wafer. As a result, the vertical MOSFET of the present invention has improved on-state resistance, reduced parasitic capacitance and higher breakdown voltage.

12 Claims, 13 Drawing Sheets

VERTICAL MOSFET AND METHOD OF MANUFACTURING THEREOF

BACKGROUND OF THE INVENTION

The present invention relates to a semiconductor device and the method of manufacturing the semiconductor device, and more particularly to a vertical field effect transistor and the method of manufacturing the vertical field effect transistor.

A vertical field effect transistor (hereinafter referred in to "vertical MOSFET") has been used over a variety of industrial fields in recent years because the vertical field effect transistor is simple in its drive circuit and can operate in a high-frequency region since it has excellent frequency characteristic, etc. The vertical field effect transistor is used over various fields, and thus demands increased performance has occurred. For example, demand for reduction of a resistant value (on-state resistance) during operation and reduction of a parasitic capacitance, as well as other characteristic has increased recently.

As a means for reducing the resistant value during operation, there has been proposed a structure in which a groove is defined in a wafer surface so that a portion in the vicinity of the groove is employed as a channel. An example of the vertical MOSFET of this type is introduced in ISPSD'93 pp. 135 to 140.

In this example, the groove is generally formed in the wafer surface through an Si etching process and an LOCOS (local oxidation of silicon) oxidizing process. As a method of manufacturing the conventional vertical MOSFET of this type, Japanese Patent Unexamined Publication No. Hei 7-321319 provides one example.

FIG. 9 is a cross-sectional view showing a structure of the conventional vertical MOSFET. Referring to FIG. 9, a wafer 110 is made up of an $n^+$-type semiconductor substrate 101 which is made of $n^+$-type silicon having an impurity concentration of approximately $10^{20}$ cm$^{-3}$ and 100 to 300 μm in thickness, and an $n^-$-type epitaxial layer 102 which is allowed to epitaxially grow on the $n^+$-type semiconductor substrate 101 and made of $n^-$-type silicon having an impurity concentration of approximately $10^{16}$ cm$^{-3}$ and approximately 7 μm in thickness. A plurality of unit cells that form vertical MOSFETs, respectively, are formed on a main surface of the wafer 110 ($n^-$-type epitaxial layer 102 side) in the shape of a lattice.

On the main surface of the wafer 110, a U-shaped groove (hereinafter referred to as "U-groove") is formed in such a manner that a dimension from center to center of adjacent unit cells becomes about 12 μm. The U-groove is formed by allowing a LOCOS oxide film to be formed on an inner wall of a groove which has been previously formed. Ions are implanted using the LOCOS oxide film as a mask and thermally diffused, an $n^+$-type source region 104 of about 1 μm in depth and a p-type base region 103 of about 3 μm in depth are formed in a self alignment manner, respectively.

The portion of the p-type base region 103 which is in the vicinity of the side wall of the U-groove is used as a channel 112.

A gate oxide film 105 of about 60 nm in thickness is formed on the inner wall of the U-groove and a gate electrode 106 of about 400 nm in thickness which is made of polysilicon is formed on the gate oxide film 105. Also, an interlayer insulation film 107 of about 1 μm in thickness which is made of BPSG (boron phosphate silicate glass) is formed on the gate electrode 106.

Also, on a portion of the p-type base region 103, which is adjacent to the $n^+$-type source region 104, there is formed a $p^+$-type base contact region 109 of about 0.5 μm in depth. A source electrode 108 which is formed on the interlayer insulation film 107 including aluminum, and the $n^+$-type source region 104 as well as a $p^+$-type base contact region 109 are in ohmic contact with each other through a contact hole 111, respectively. A drain electrode (not shown) is formed to be in ohmic contact with a rear surface of the $n^+$-type semiconductor substrate 101. A description will be given of a method of manufacturing the conventional vertical MOSFET shown in FIG. 9 follows using FIGS. 10A and 10B.

First, a silicon oxide film 60 and a silicon nitride film 63 of about 200 nm are deposited on the eptaxial layer 102 and are patterned to thereby form an opening pattern in the shape of a lattice which is perpendicular to and in parallel with a crystal face (011). Thereafter, etching is conducted on the silicon oxide film 60 using the silicon nitride film pattern as a mask to remove a part of the silixon oxide film 60 (a portion that forms a groove). Then, chemical dry etching is isotropically conducted to form a groove on the front surface of the $n^-$-type epitaxial layer 102 as shown in FIG. 10A. It should be noted that a curve is formed on the opening portion of the groove.

Then, an inner wall of the groove is thermally oxidized with the silicon nitride film 63 as a mask as shown in FIG. 10B. This is a well-known LOCOS oxidation, and a selective oxide film, that is, an LOCOS oxide film is formed through the thermal oxidation at a normal LOCOS oxidation temperature, for example, 950–980° C. At the same time, the $n^-$-type epitaxial layer 102 is eroded by the LOCOS oxide film, to thereby form a U-groove. It should be noted that the curve formed through the chemical dry etching process still remains on the side wall of the U-groove as a curved portion 113. Also, the condition of chemical dry etching and the condition of LOCOS oxidation are set so that a face orientation of the channel 112 becomes a face close to (111). As a result, there are few defects, in particular, cristal defects, at an inner wall surface having the face (111) in U-groove.

Subsequently, boron ions are implanted in a self alignment manner with the LOCOS oxidation film as a mask, and thermal diffusion is conducted until the junction depth becomes about 3 μm, to thereby form a p-type base region 103 (which is integral with the above p-type diffusion layer).

After the formation of the p-type base region 103, phosphorus ions are implanted using a resist film, formed by lithographic technology, and the LOCOS oxide film as masks. Next, thermal diffusion is conducted to create a function depth of approximately ±0.5 to 1.0 μm, to thereby form the $n^+$-type source region 104.

In this example, to form the $n^+$-type source region 104, phosphorus ions are allowed to thermally diffuse deeper than the curved portion 113, which has been formed during the above chemical dry etching. The deep diffusion is used to prevent the flow of electrons from being interrupted as a result of electron accumulation at the curved portion 113.

Then, after the removal of the LOCOS oxide film through etching, the gate oxide film 105 of about 60 μm in thickness is formed on the inner wall of the U-groove. Next, polysilicon of about 400 nm is deposited on the gate oxide film 105 and patterned to form the gate electrode 106. Subsequently, the $p^+$-type base contact region 109 is formed using a patterned resist film as a mask, and BPSG is allowed to grow on the main surface of the wafer 110, to thereby form the interlayer insulation film 107. Next, the contact hole 111 is opened in a part of the interlayer insulation film 107 which is above the n+-type source region 104. The p+-type base contact region 109, and the source electrode 108, including an aluminum film, are formed in such a manner so as to have ohmic contact with the n+-type source region 104 and the p+-type base contact region 109, respectively. Finally, the drain electrode (not shown), made of Ti/Ni/Au, is formed on the rear surface of the n+-type semiconductor substrate 101.

In the vertical MOSFET thus manufactured, the n+-type source region 104 and the p-type base region 103 are formed, respectively, in such a manner that the channel region 112 is formed in the portion deeper than the curved portion 113 of the side wall of the U-groove. Therefore, a flow of electrons is prevented from being accumulated on the curved portion 113, that is, such a MOSFET has a higher mobility of carriers. Accordingly, an on-state voltage of the vertical MOSFET becomes low (the on-state resistance becomes low).

However, in the above-mentioned conventional vertical MOSFET has a problem of large parasitic capacitance because the source region is formed deeper than the curved portion of the U-groove.

Further, there is a problem with the gate oxide film 105 being locally thinned at the curved portion and the electric field on the protrusion-shaped curved portion being concentrated. Therefore, the insulation breakdown voltage of the gate oxide film is reduced.

SUMMARY OF THE INVENTION

An object of the present invention is to provide a vertical MOSFET and a method of manufacturing the vertical MOSFET, which is low in parasitic capacitance, and which prevents the deterioration of the insulation breakdown voltage of a gate oxide film.

A semiconductor device of the present invention comprises:

a semiconductor wafer having a groove; a source region formed on the semiconductor wafer and having at least one side face which is essentially flat; and an insulating film covering a surface of the semiconductor wafer exposed by the groove and said essentially flat side surface of the source region so that the side face of the source region couple to the insulating film in the groove is essentially flat.

A method of manufacturing a semiconductor device of the present invention, comprising the steps of: selectively etching a semiconductor wafer to form a groove in the semiconductor wafer; performing a method of local oxidation of silicon (LOCOS) to form a LOCOS film on the semiconductor wafer in the groove so that a whole side surface of the semiconductor wafer exposed by the groove is substantially vertical and essentially flat; removing the LOCOS film in the groove; forming a thermal insulating film on the semiconductor wafer in the groove; and forming a conductive film on the thermal insulating film.

BRIEF DESCRIPTION OF THE DRAWINGS

The above and other objects, advantages and features of the present invention will be more apparent from the following description taken in conjunction with the accompanying drawings, in which:

FIG. 1 is a diagram showing a structure of a vertical MOSFET according to the present invention, wherein

FIGS. 4A and 4B are diagrams for explaining the effect obtained by the method of manufacturing the vertical MOSFET according to the first embodiment of the present invention, in which FIG. 4A is a side cross-sectional view showing a structure of a U-groove in the vertical MOSFET according to the present invention and FIG. 4B is a side cross-sectional view showing a structure of a U-groove in the conventional vertical MOSFET.

DETAILED DESCRIPTION OF THE PREFERRED EMBODIMENTS

Figure 1A:
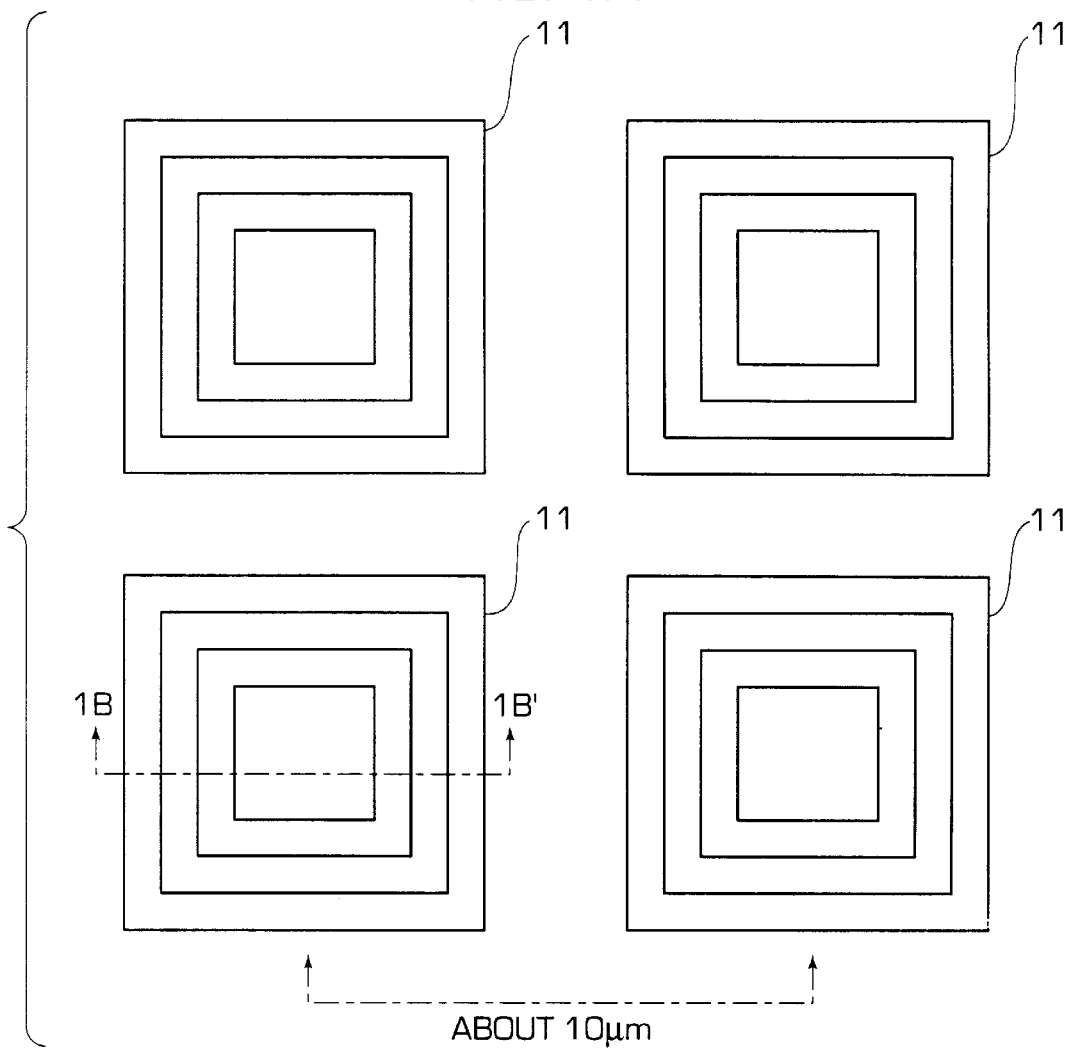
FIG. 1A is a top view of the structure.
Figure 1B:
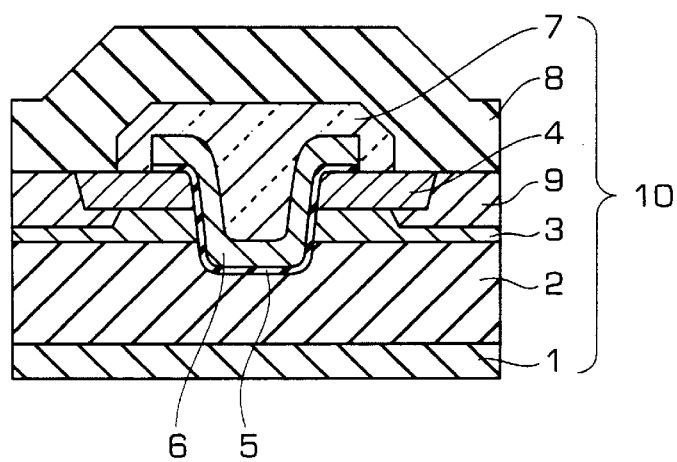
FIG. 1B is a side sectional view of the structure viewed from a line 1B–1B'.

FIGS. 1A and 1B are a diagram showing a structure of a vertical MOSFET according to the present invention. An n-channel type vertical MOSFET will be described as an example hereinafter.

Referring to FIGS. 1A and 1B, a wafer 10 is made up of an n+-type semiconductor substrate 1 made of n+-type silicon, and an n−-type epitaxial layer 2 formed by allowing an n−-type silicon to epitaxially grow on the n+-type semiconductor substrate 1. A plurality of unit cells 11 are formed on the main surface of the wafer 10 in the shape of a lattice. Also, on the main surface of the wafer 10, there is formed the U-groove in such a manner that the dimension of the unit cell becomes about 10 μm.

Figure 9:
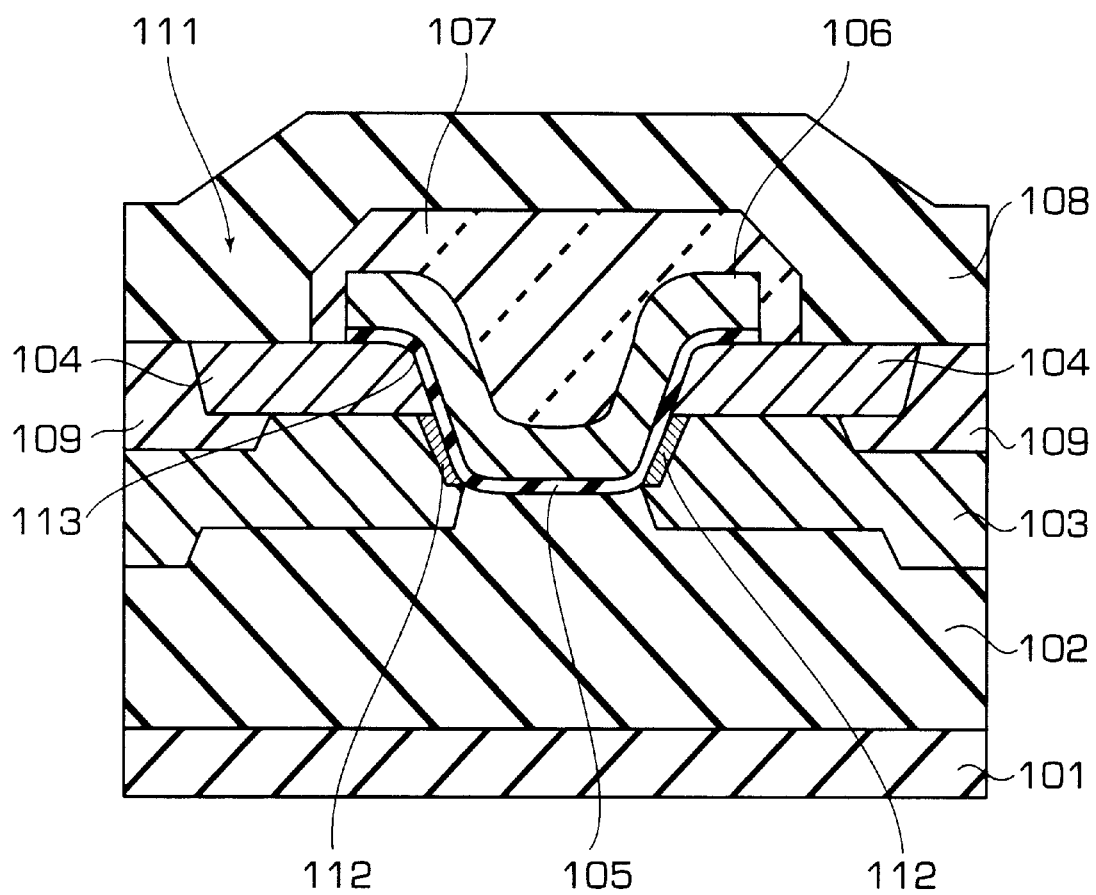
FIG. 9 is a cross-sectional view showing a structure of a conventional vertical MOSFET.
Figure 10A:
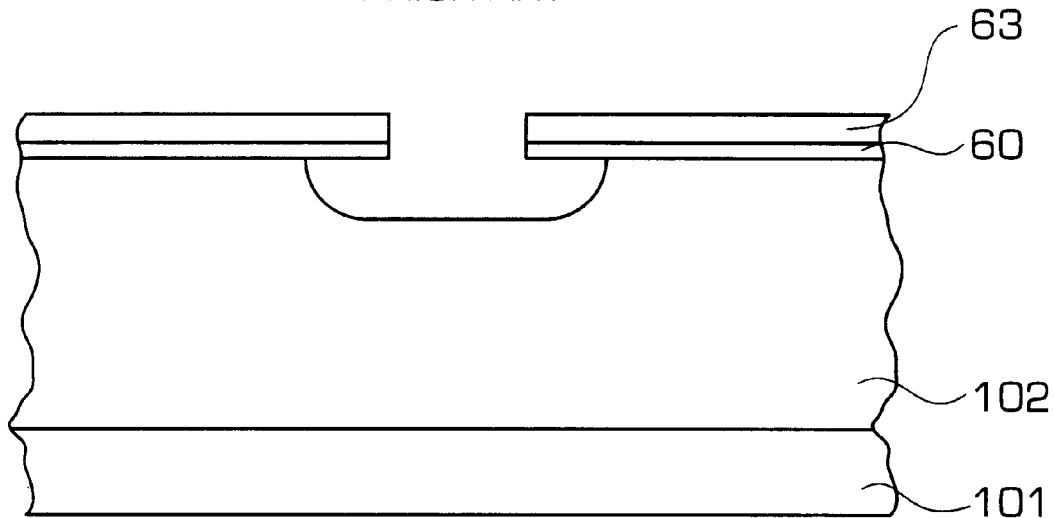
FIGS. 10A and 10B are cross-sectional views showing the respective steps for forming a conventional vertical MOSFET shown in FIG. 9.
Figure 10B:
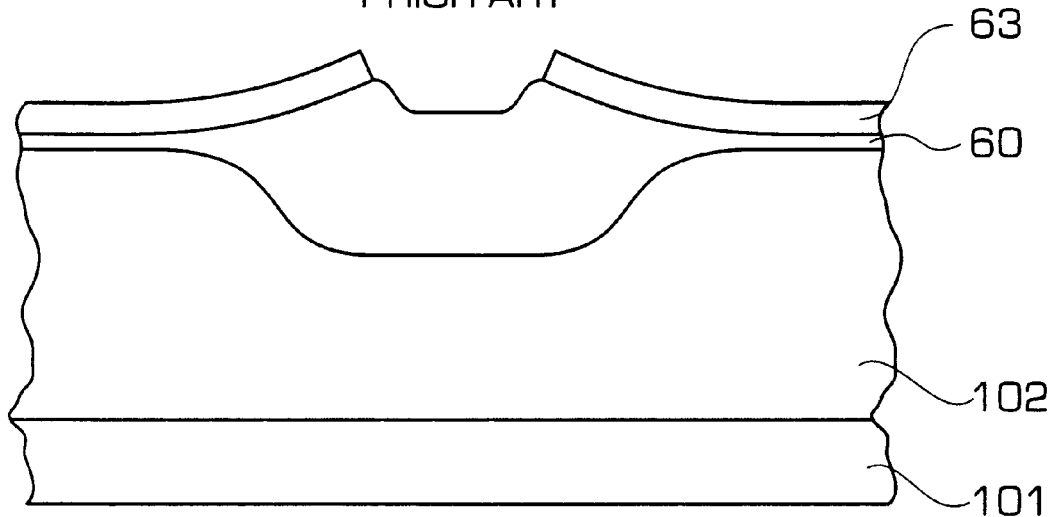

In this example of the method of manufacturing the vertical MOSFET according to the present invention, the U-groove is formed by the formation of the LOCOS oxide film at a high temperature ranging from 1100 to 1200° C. on the inner wall of the groove, which has been formed on the main surface of the wafer through the silicon etching process. As a result of the inner wall of the groove formed through the silicon to etching process being oxidized with the LOCOS at a high temperature of from 1100 to 1200° C., the curved portion of the side wall of the U-groove (refer to FIG. 9), which occurs in the conventional LOCOS oxidizing process, is eliminated, to thereby form the side wall of the U-groove that is an essentially flat surface.

Next, boron ions and phosphorus ions are implanted in the wafer 10 (which has been subjected to the LOCOS oxidation), respectively, to thereby form the p-type base region 3 and the n+-type source region 4 through double diffusion, respectively. After the removal of the LOCOS oxide film, the gate oxide film 5 is formed on the inner wall of the U-groove. Then a gate electrode 6 made of polysilicon is formed on the gate oxide film 5.

Then, an interlayer insulation film 7 is formed on the gate electrode 6 by BPSG or the like. A source electrode 8 made of metal such as aluminum, etc., which is in ohmic contact with the n+-type source region 4, and the p+-type base contact region 9 are formed through the contact hole opened in the interlayer insulation film 7. A drain electrode (not shown) is formed on the rear surface of the n+-type semiconductor substrate 1.

The operation of the vertical MOSFET according to the present invention will now be described with reference to FIG. 2.

Figure 2:
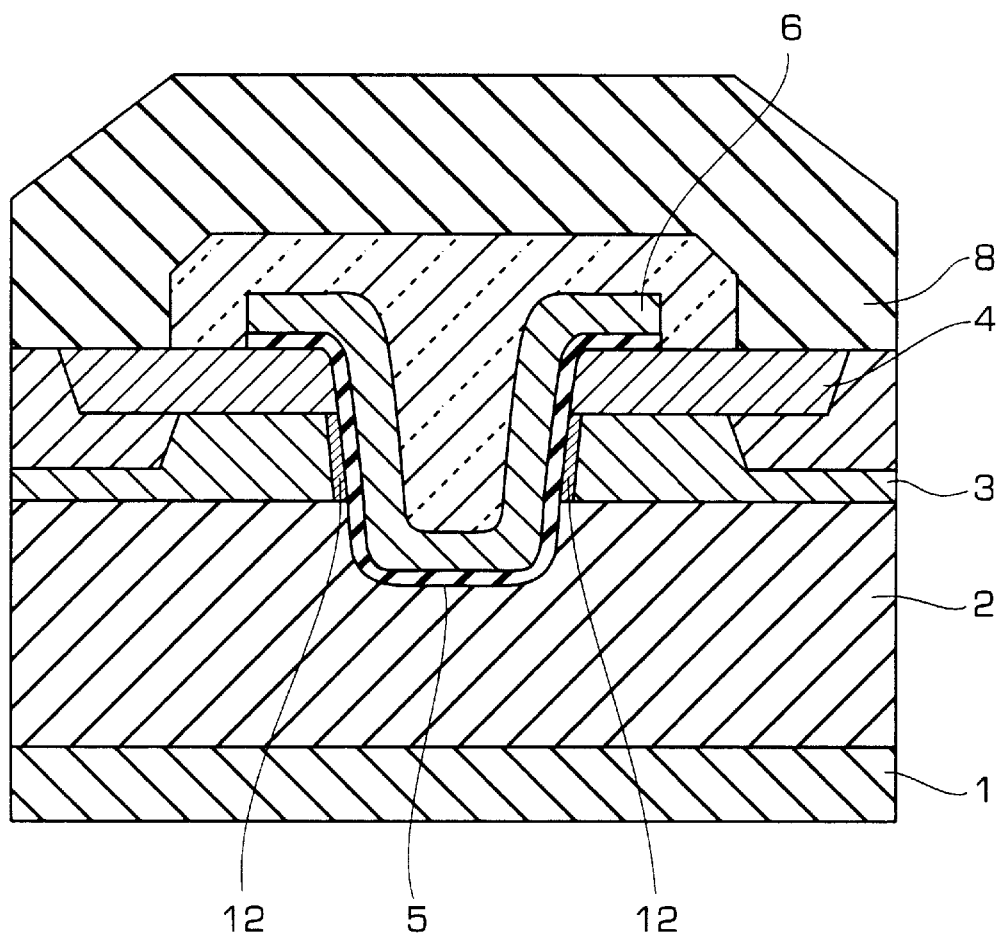
FIG. 2 is a side cross-sectional view showing an enlarged main portion of the vertical MOSFET shown in FIG. 1.

In case of the n-channel type vertical MOSFET shown in FIG. 2, for example, when 0 V is applied to the source electrode 8, +10 V is applied to the gate electrode 6, and +0.1 V is applied to the drain electrode, respectively, a portion of the p-type base region 3 which is in contact with the side wall of the U-groove is inverted in polarity, resulting in an n-type semiconductor and becomes the channel 12. As a result, electrons implanted from the source electrode 8 flow into the drain electrode via the n+-type source region 4, the channel 12, the n−-type epitaxial layer 2 and the n+-type semiconductor substrate 1.

In this case, the resistance (on-state resistance) of the vertical MOSFET during the operation can be calculated on the basis of a relation of a current flowing between the source and the drain and a potential difference between the source and the drain. Alternatively, the on-state resistance can be calculated as a sum of the respective resistant values of the source electrode 8, the n+-type source region 4, the channel 12, the n−-type epitaxial layer 2, the n+-type semiconductor substrate 1 and the drain electrode.

In this example, a resistant value $R_{ch}$ of the channel 12 can be expressed by an expression stated below.

$$R_{ch} = (L/W) \cdot \mu C_{ox} (V_G - V_T)$$

where L is a channel length, W is a channel width, $\mu$ is the mobility of electrons, $C_{ox}$ is a capacitance, $V_G$ is a gate voltage, and $V_T$ is a gate threshold value voltage.

In the case of the conventional vertical MOSFET where the curved portion exists in the U-groove within the channel 12, the mobility $\mu$ of electrons in the channel 12 is deteriorated so that the resistant value $R_{ch}$ of the channel 12 and the on-state resistance increases. However, in the method of manufacturing the vertical MOSFET according to the present invention, because the curved portion of the U-groove is eliminated, such a problem does not occur. Further, since the curved portion is eliminated, the depth of the n+-type source region 4 and the depth of the p-type base region 3 can be made more shallow. In particular, the n+-type source region 4 can be made shallow which thereby reduces the parasitic capacitance. Furthermore, elimination of the curved portion enables the gate oxide film 5 to be an uniform thickness and thus improves the yield. Finally, the insulation breakdown voltage of the gate oxide film 5 is high and does not deteriorate because an electric field is not concentrated since no curved portion exists in the source area of the U-groove.

It should be noted that although a case of the n-channel type vertical MOSFET is described in this embodiment, the present invention is similarly applicable to a case of the p-channel type vertical MOSFET.

A method of manufacturing the n-channel vertical MOSFET according to the first embodiment of the present invention will now be described with reference to FIGS. 3A to 3F.

A wafer 10 has an n−-type epitaxial layer 2 of about 5 $\mu$m in thickness doped with a phosphorus (P) of about $2 \times 10^{16}$ cm$^{-3}$ formed on the n+-type semiconductor substrate 1. The semiconductor substrate 1 has a crystal face that is (100), whose orientation flat face is (100) and which has been doped with arsenic (As) of about $2 \times 10^{19}$ cm$^{-3}$.

Figure 3A:
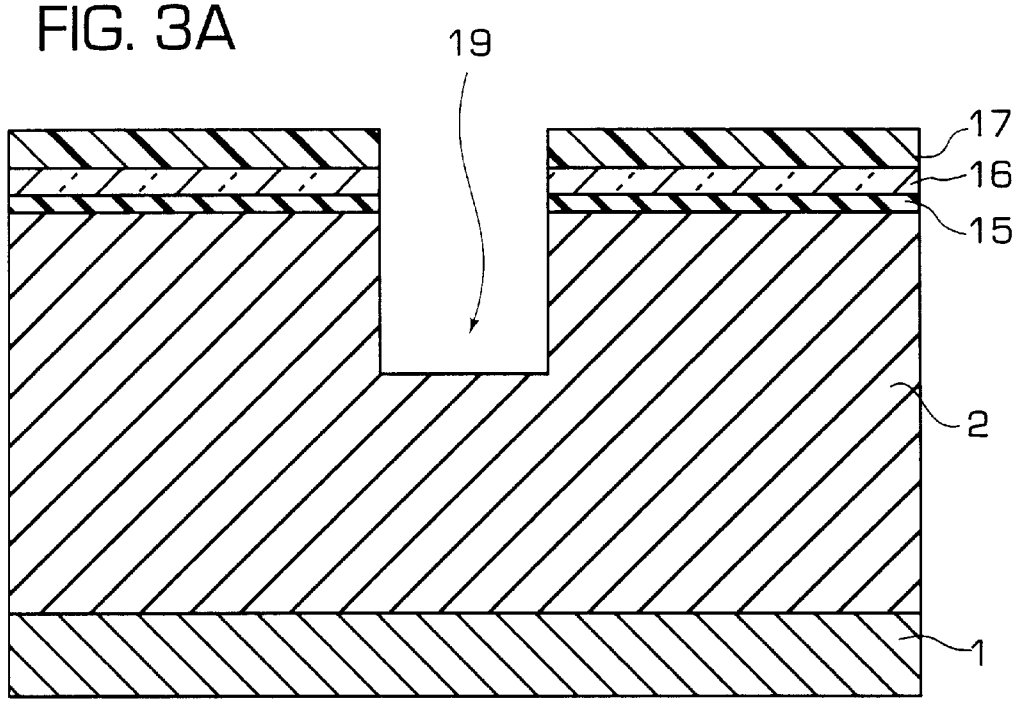
FIGS. 3A–F are cross sectional views showing the respective steps in the method of manufacturing a vertical MOSFET according to the first embodiment of the present invention.

In FIG. 3A, first, an oxide film 15 of about 500 angstrom is formed on the n−-type epitaxial layer 2 of wafer 10. A nitride film 16 of about 1500 angstrom is then formed on the oxide film 15. Subsequently, the oxide film 15 and the nitride film 16 are patterned through the lithography technology, respectively. Parts of the oxide film 15 and the nitride film 16 (portions that form a groove) are sequentially removed through reactive ion etching (RIE).

Then, a resist film 17 that was used for etching the oxide film 15 and the nitride film 16 is used as the pattern to etch the surface of the n−-type epitaxial layer 2 to a depth of about 1.3 $\mu$m using reactive ion etching, forming a groove 19. In this step, the surface of the n−-type epitaxial layer 2 is etched with nearly the same dimension as that of the opening portion of the resist film 17 in such a manner that the side surfaces of the groove 19 is prevented from being removed more than the opening portion of the resist film 17. Care is taken to form substantially vertical walls and small cell pitch of the unit cell 11 so as to minimize the on-state resistance RON of the vertical MOSFET during operation and the overall cell size.

Figure 3B:
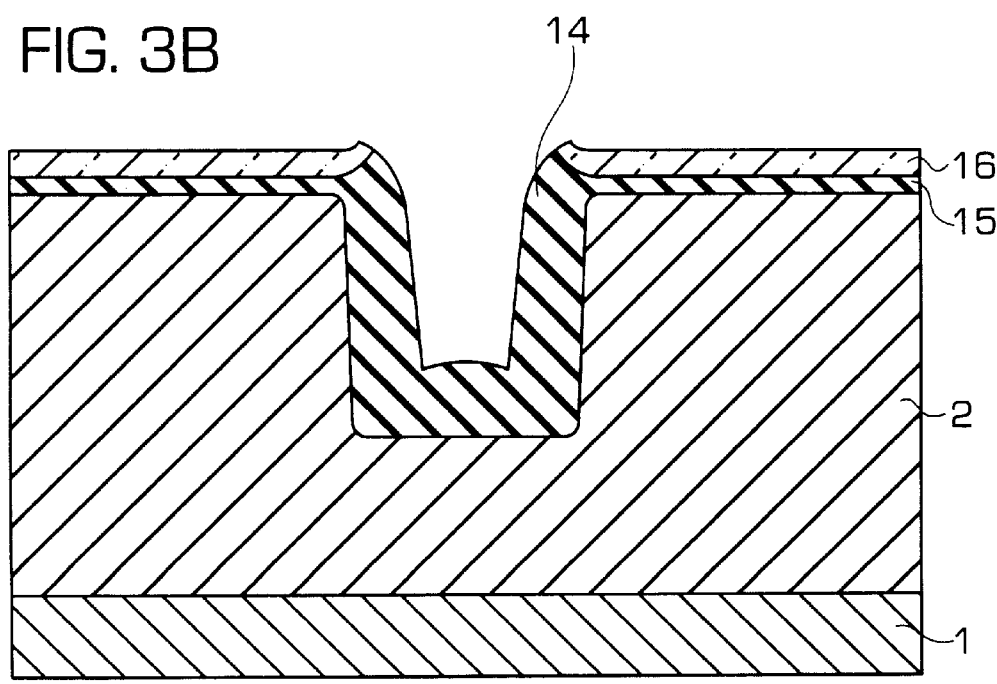

Subsequently, as shown in FIG. 3B, the resist film 17 is removed and the inner wall of the groove 19 is oxidized by LOCOS at a temperature of about 1140° C. to thereby form the LOCOS oxide film 14 having a thickness of about 7000 angstrom. With the RIE etching and LOCOS oxidation performed at 1100° C. or higher, the side wall of the U-groove is a substantially vertical and has a flat surface. On the other hand, a temperature lower than 1100° C. causes the curved portion of the conventional vertical MOSFET to remain on the side wall of the U-groove. Therefore, the present inventor established that the curved portion is eliminated by performing LOCOS oxidation at 1100° C. or higher.

Further, if when the LOCOS oxidation is conducted at a temperature higher than 1200° C., there is the possibility of causing a drawback such that cracks, etc., occur in the nitride film 16. Thus, it is preferable that the LOCOS oxidizing process is conducted at a temperature of from 1100 to 1200° C.

In general, the inventor has found that in the case where silicon is oxidized at a high temperature of 1000° C. or higher so that silicon dioxide ($SiO_2$) is allowed to grow, the silicon dioxide is softened and fluidized and a stress is relaxed to make the surface smooth. However, as described above, in order to form a substantially vertical and essentially flat inner wall of the U-shaped groove, a still higher energy is needed so that the LOCOS oxidation temperature needs to be set to 1100° C. or higher.

In the case where the unit cell 11 is formed in the shape of a square, with the formation of the U-groove under the above conditions, the angle of the channel 12 can be set to nearly 90° with respect to the direction of the main surface of the wafer 10. In this case, the crystal face of the channel 12 becomes (100). Further, the mobility of electrons depends on its crystal face and becomes maximum when the crystal face is (100). As a result, the on-state resistance $R_{ON}$ of the vertical MOSFET during the operation is minimized. Also, since an interface level depends on its crystal face and will become minimum when it is (100), higher reliability (than when using another crystal face of, for example (111)) is obtained.

Figure 3C:
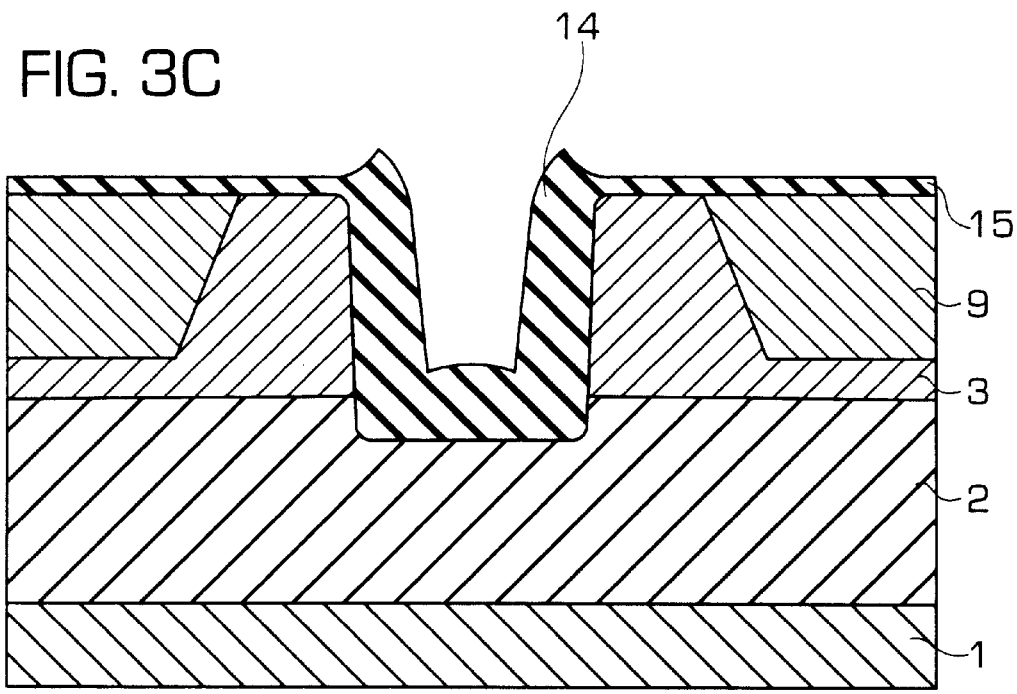

Then, referring to FIG. 3C after the LOCOS step is completed, boron ions are implanted in a self alignment manner, using the LOCOS oxide film 14 as a mask, and are thermally diffused to form the p-type base region 3 of about 1.3 μm in depth. Next, the p$^+$-type base contact region 9 is formed using lithography technology.

Figure 3D:
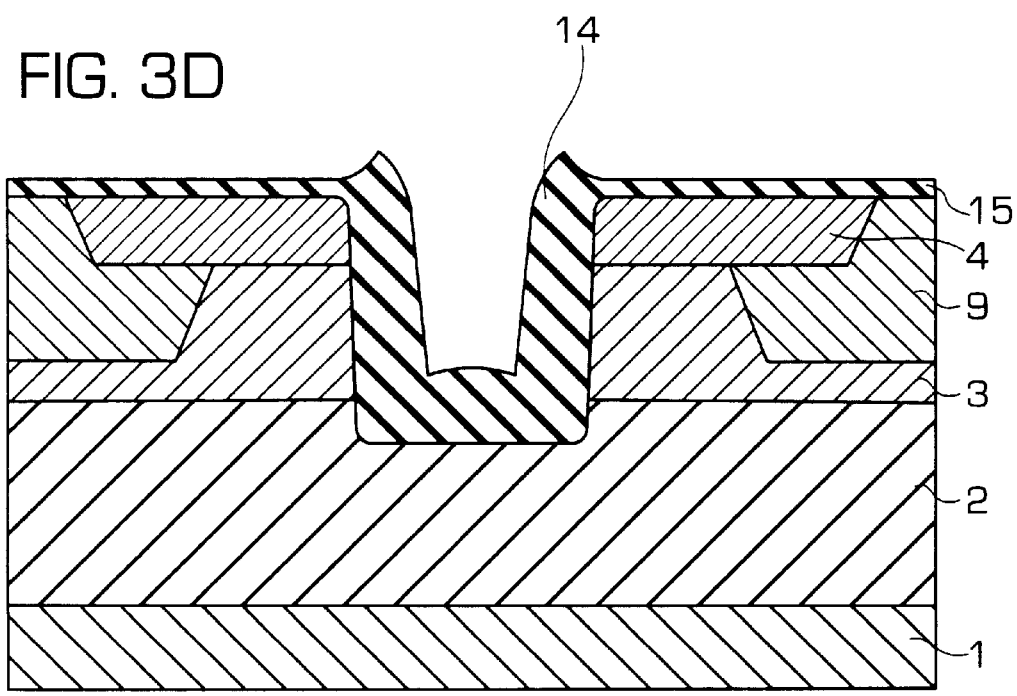

Subsequently, as shown in FIG. 3D, the n$^+$-type source region 4 is formed using the LOCOS oxide film 14 and a resist film formed through lithography as masks. Since the curved portion of the conventional vertical MOSFET is eliminated from the side wall of the U-groove for the present invention, the depth of diffusion of the n$^+$-type source region 4 can be freely set to any desired level. Therefore, in this example, the n$^+$-type source region 4 is formed to a depth of about 0.4 μm to reduce and optimize the parasitic capacitance.

Figure 3E:
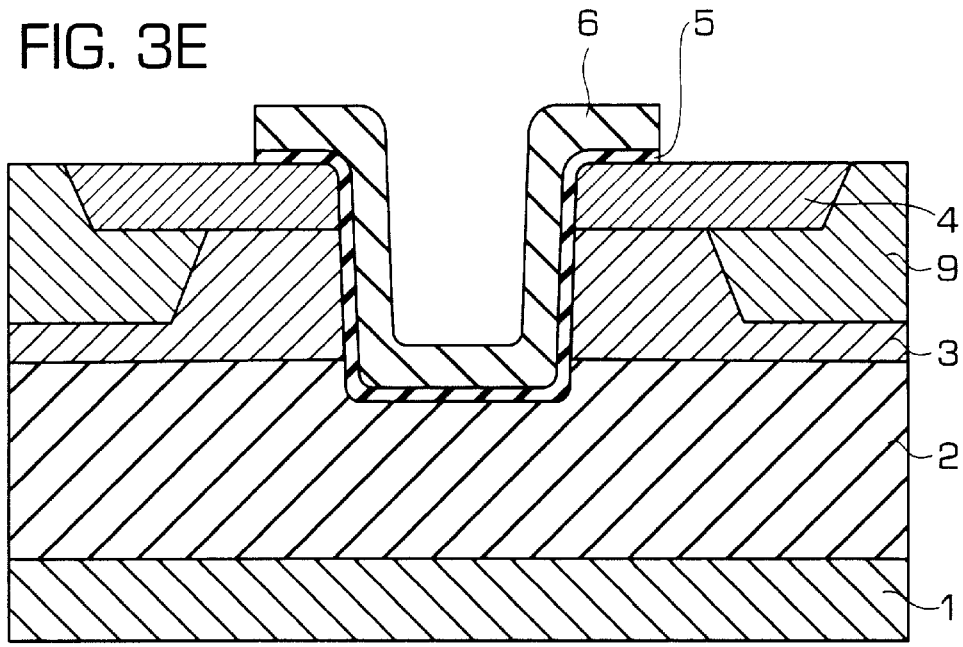

Then, as shown in FIG. 3E, after the removal of the LOCOS oxide film 14 through wet etching, a gate oxide film 5 of about 500 angstrom is formed on the inner wall of the U-groove. Next, polysilicon of about 5000 angstrom is deposited on the gate oxide film 5 to form a gate electrode 6. Phosphorus is diffused in polysilicon for the purpose of reducing the resistant value of the gate electrode 6. The polysilicon is then patterned in a predetermined shape through lithography, thus forming the gate electrode 6.

Figure 3F:
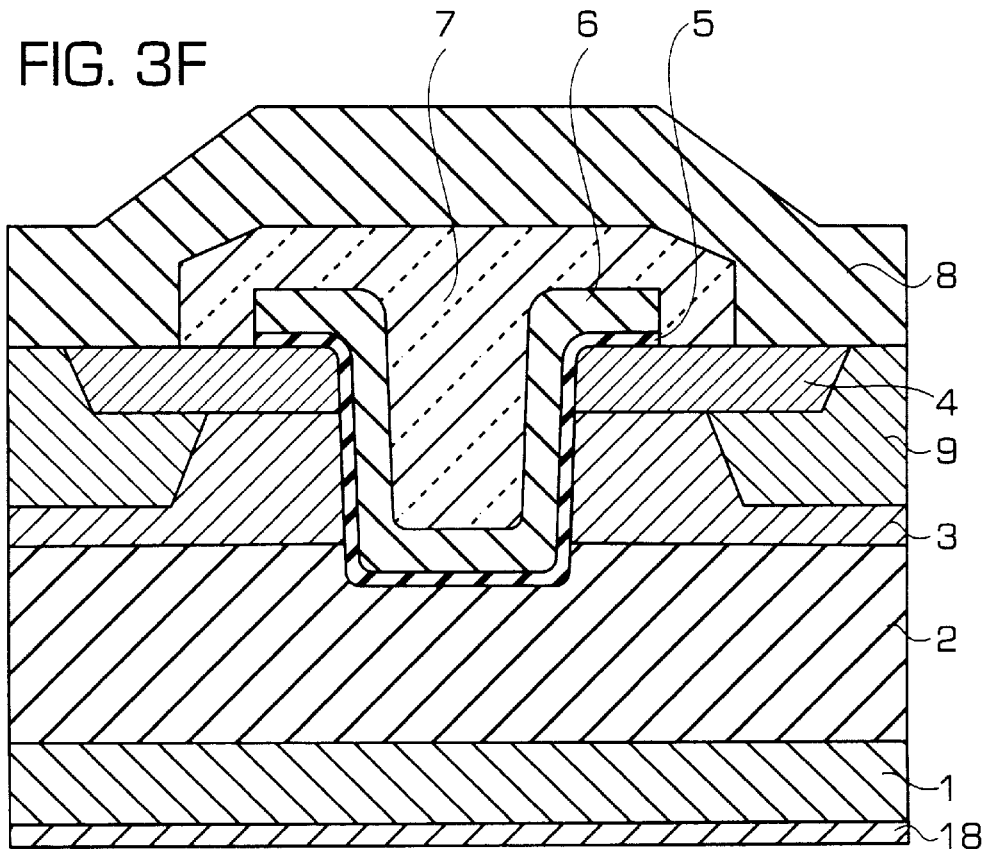

Thereafter, as shown in FIG. 3F, the BPSG film is allowed to grow, to thereby form the interlayer insulation film 7 of about 10,000 angstrom. A part of the interlayer insulation film 7 is opened, and a conductive material, for example aluminum or the like, is deposited therein through sputtering method to form the source electrode 8, in contact with the p$^+$-type base contact region 9 and the n$^+$-type source region 4.

Finally, metal such as Au/Ni/Ag, etc., is coated on the rear surface of the n$^+$-type semiconductor substrate 1 to form the drain electrode 18.

Figure 4A:
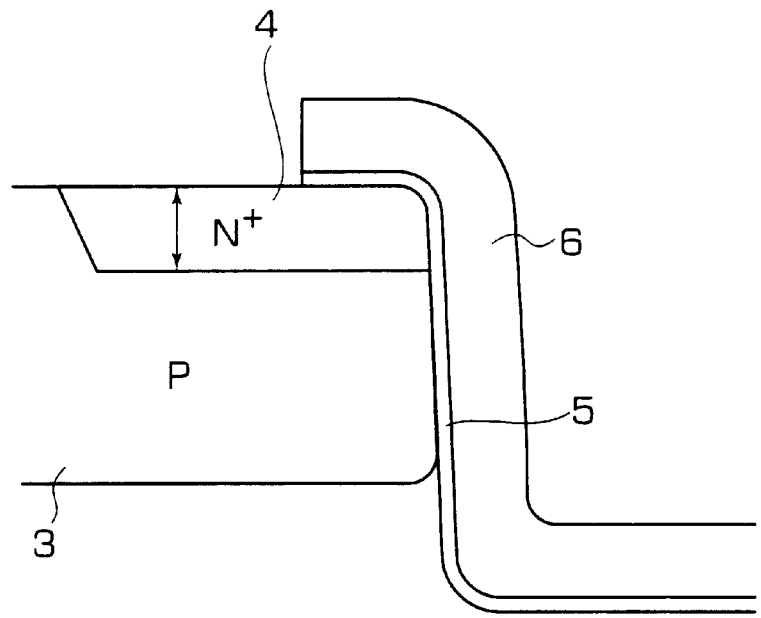
Figure 4B:
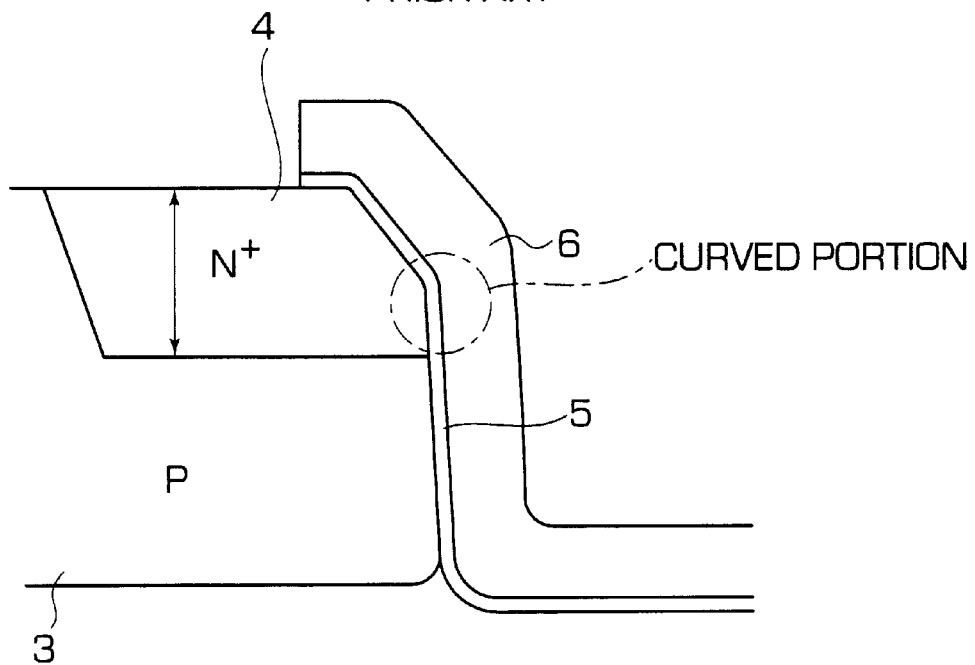
Figure 5:
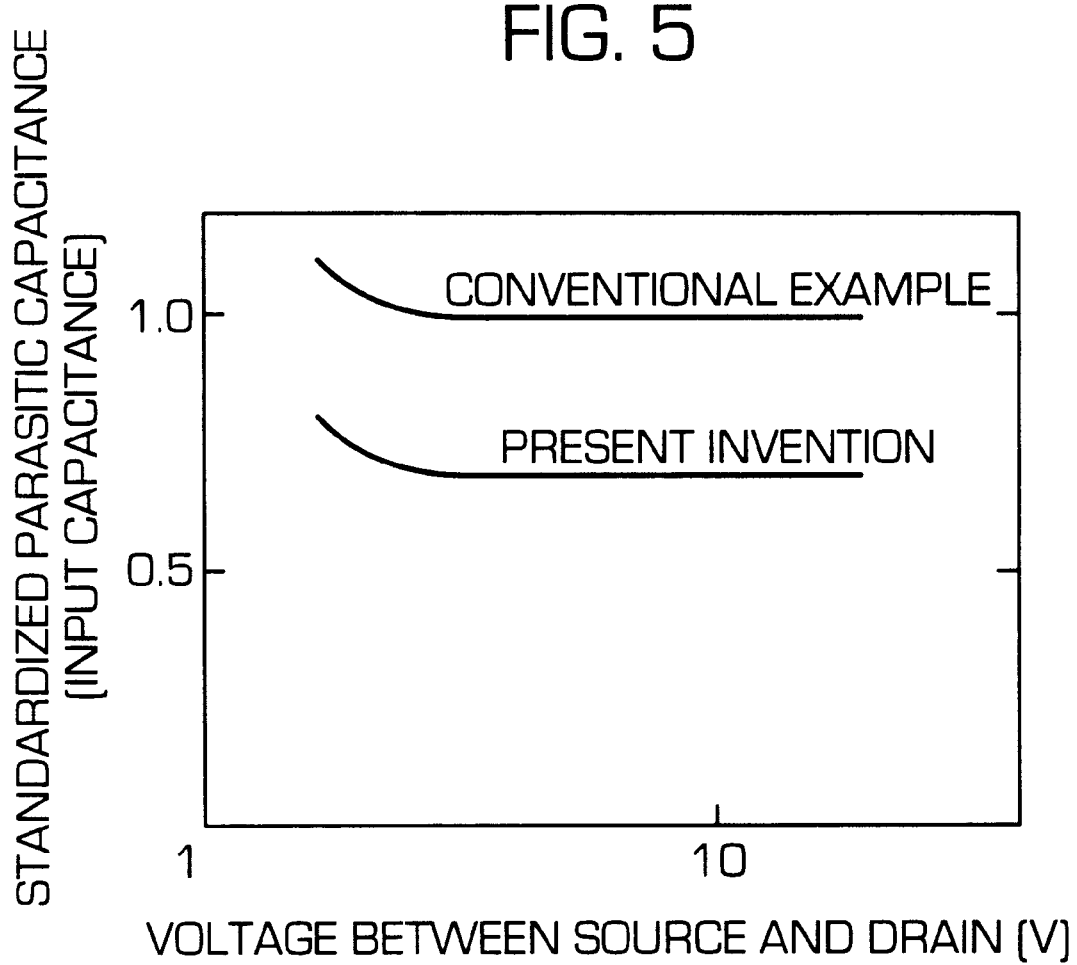
FIG. 5 is a diagram for explaining the effect obtained by the method of manufacturing the vertical MOSFET according to the first embodiment of the present invention, which is a graph representing a relation of a standardized parasitic capacitance value with respect to a voltage between the source and the drain.

According to the method of manufacturing the vertical MOSFET according to this embodiment, as shown in FIGS. 4A and 4B, because the curved portion is eliminated from the main portion of the side wall of the U-groove, the n$^+$-type source region 4 can be formed using arsenic or the like, and the depth of diffusion of the n$^+$-type source region 4 can be set to about 0.3 μm. Likewise, the p-type base region 3 can be made shallow.). Therefore, the parasitic capacitance can be reduced about 30% in comparison with the conventional vertical MOSFET since the area of an overlapped portion of the gate electrode 6 and the n$^+$-type source region 4 can be reduced (see FIG. 5).

Further, in case of the conventional structure shown in FIG. 4B, the p-type base region 3 needs to be deeply formed and the period of time necessary for thermal diffusion becomes long. As a result, the diffusion of impurities from the n$^+$-type semiconductor substrate 1 to the n$^-$-type epitaxial layer 2 is increased. With this phenomenon, a breakdown voltage between the source and the drain is deteriorated due to reach through. For the purpose of preventing the occurrence of the reach through (preventing the breakdown voltage between the source and the drain from being reduced (deteriorated)), the n$^-$-type epitaxial layer 2 needs to be thickened. However, a thicker n$^-$-type epitaxial layer 2 results in an undesirable increase of on-state resistance during operation.

On the other hand, the vertical MOSFET of this invention enables the p-type base region 3 to be formed in a shallow manner compared to that of the conventional structure and the period of time necessary for thermal diffusion is shortened. Thus, the diffusion of impurities from the n$^+$-type semiconductor substrate 1 to the n$^-$-type epitaxial layer 2 is reduced. Therefore, the on-state resistance during operation of the vertical MOSFET of the present invention is reduced because the n$^-$-type epitaxial layer 2 can be formed more thin.

Moreover, the gate oxide film 5 can be uniformly formed and thereby improve the yield because the curved portion of the conventional MOSFET is eliminated and the side walls of the present invention are substantially vertical and essentially flat. Also, the insulation is not breakdown voltage of the gate oxide film 5 deteriorated because there is no case in which the gate oxide film 5 is locally thinly formed so as to be weakened.

A method of manufacturing a vertical MOSFET according to a second embodiment of the present invention will now be described with reference to FIGS. 6A to D, using an example of a p-channel type vertical MOSFET. The wafer used is a p$^-$-type epitaxial layer 22 being formed on a p$^+$-type semiconductor substrate 21. A plurality of unit cells (the dimension of the unit cell is about 10 μm) are formed on a main surface of the wafer in the shape of a lattice.

Figure 6A:
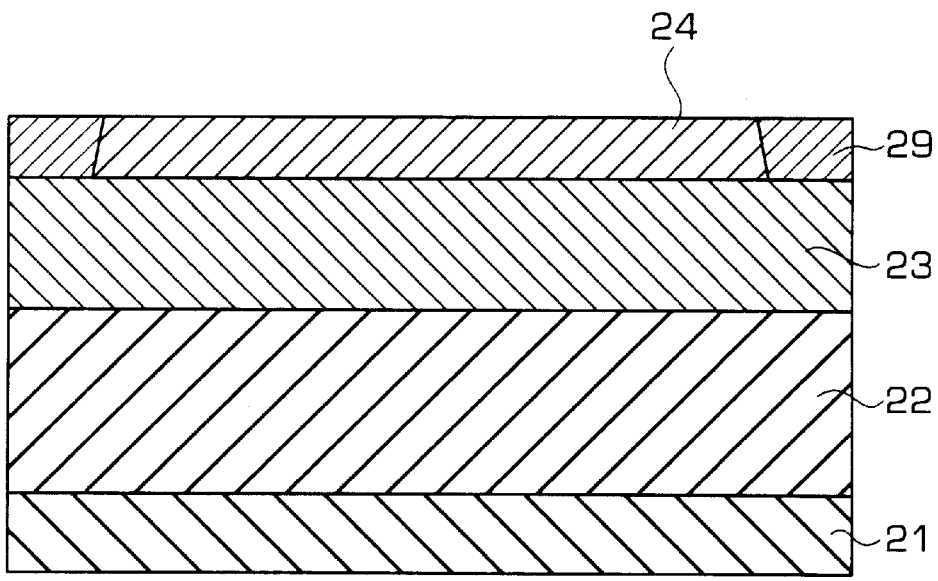
FIGS. 6A–E are cross sectional views showing the respective steps in the method of manufacturing a vertical MOSFET according to the second embodiment of the present invention.

In FIG. 6A, first, phosphorus ions are implanted in a portion of the main surface of the wafer which forms a unit cell, and then thermally diffused until its depth becomes about 1.2 μm, to thereby form an n-type base region 23. Subsequently, with a resist film formed as a mask through lithography, an n$^+$-type base contact region 29 and a p$^+$-type source region 24 are formed, respectively.

Figure 6B:
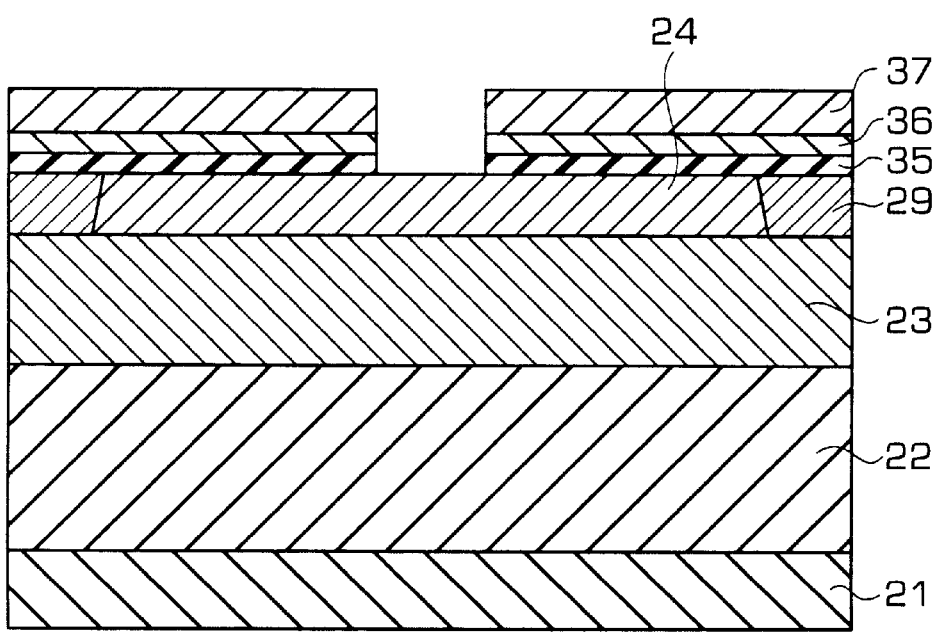

Then, as shown in FIG. 6B, an oxide film 35 and a nitride film 36 are sequentially formed on the n$^+$-type base contact region 29 and the p$^+$-type source region 24, respectively. After those layers are patterned using lithography, parts of the nitride film 36 and the oxide film 35 (portions that form a groove) are sequentially etched to be removed. Then, a resist film 37, of the same pattern as that of the resist film used for etching the oxide film 35 and the nitride film 36, is formed on the nitride film 36.

Figure 6C:
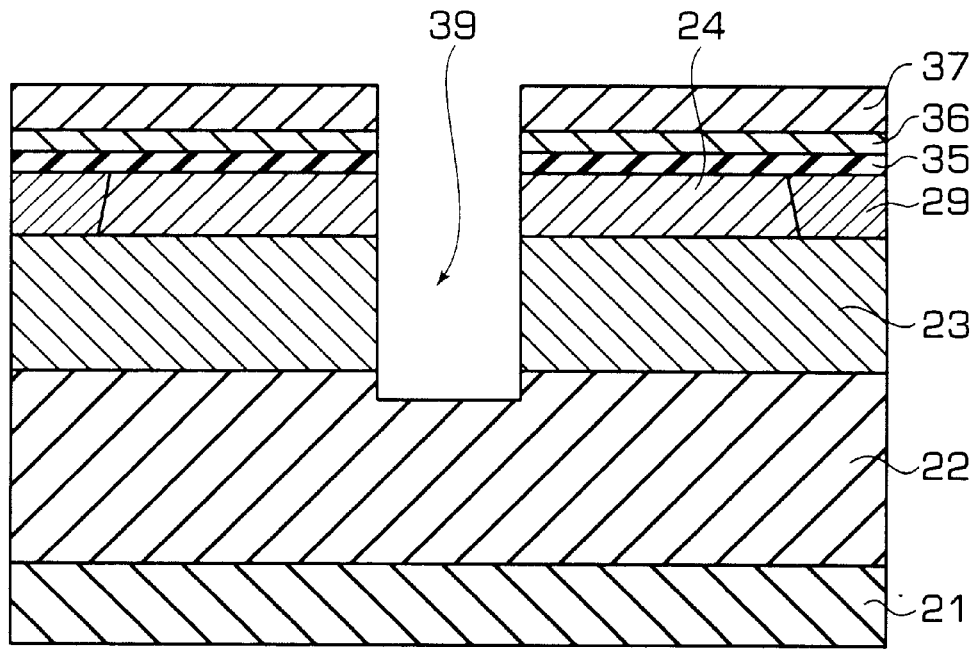

Subsequently, as shown in FIG. 6C, a groove 39 of 5 μm in depth, which reaches the p$^-$-type epitaxial layer 22, is formed through reactive ion etching.

Figure 6D:
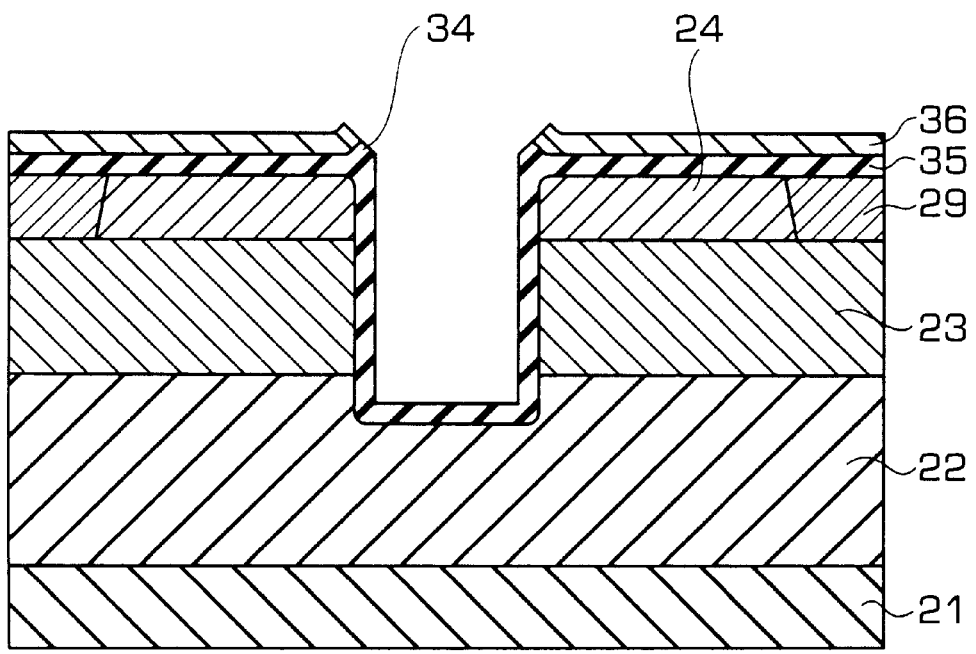

Then, as shown in FIG. 6D, after the removal of the resist film 37, an inner wall of the groove 39 is oxidized by LOCOS at 1400° C. to form an LOCOS oxide film 34 which is about 2,000 angstrom in thickness. A U-groove is formed by the LOCOS oxide film 34.

Figure 6E:
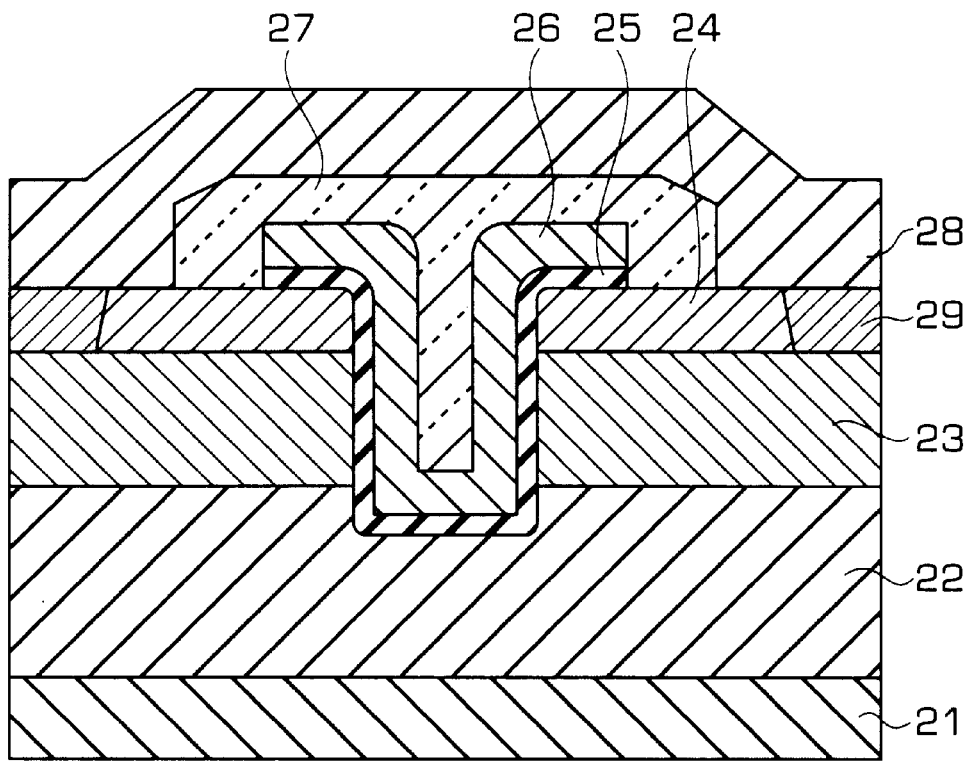

Thereafter, as shown in FIG. 6E, the nitride film 36, the oxide film 35 and the LOCOS oxide film 34 are removed, respectively. Next, a gate oxide film 25 is formed on the inner wall of the U-groove. Prior to forming gate oxide film 25, a sacrifice oxidiation of about 500 angstrom may be performed.

Through the subsequent process steps, a gate electrode 26, an interlayer insulation film 27 and a source electrode 28 are formed in the same manner as those in the first embodiment.

Figure 7:
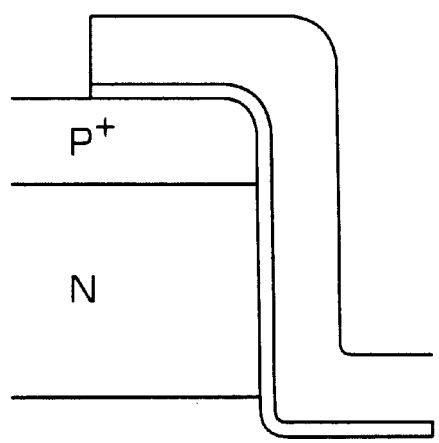
FIG. 7 is a diagram for explanation of the effect obtained by the method of manufacturing the vertical MOSFET according to the second embodiment of the present invention, which is a side cross-sectional view showing a structure of the U-groove.

Similar to the first embodiment, in the manufacturing method of this embodiment, since the LOCOS oxidation is conducted at a high temperature ranging from 1100 to 1200° C., no curved portion is formed and the side wall of the U-groove is substantially vertical and essentially flat as shown in FIG. 7. As a result, since the p$^+$-type source region 24 can be formed in a shallow manner, the parasitic capacitance of the vertical MOSFET can be reduced. Further, the gate oxide film 25 is uniformly formed, the yield is improved, and the insulation breakdown voltage of the gate oxide film 25 has high capability since it is prevented from being deteriorated.

Figure 8:
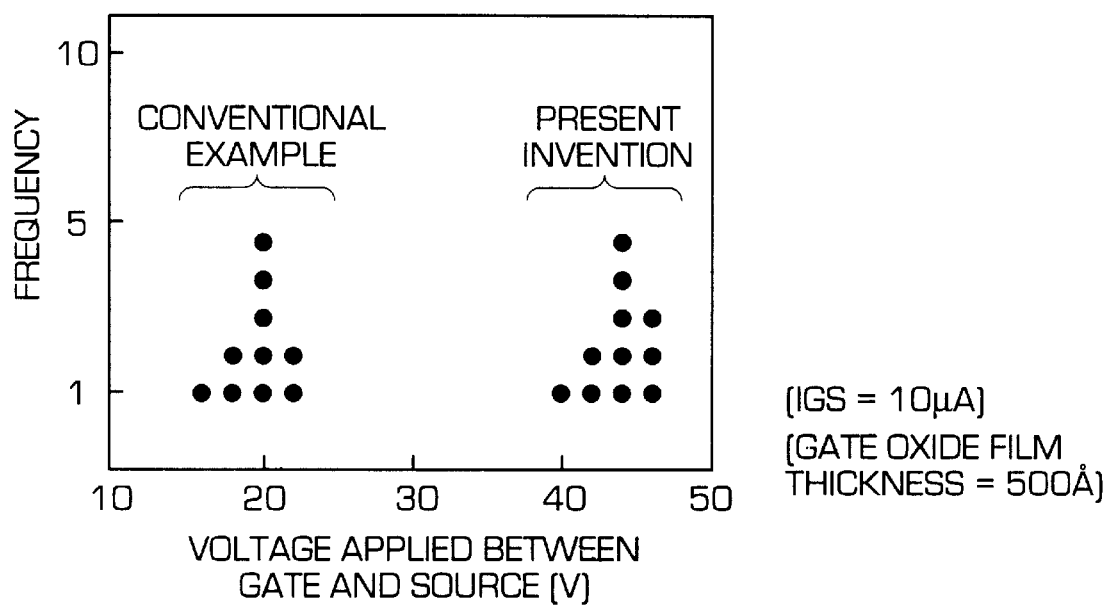
FIG. 8 is a diagram for explanation of the effect obtained by the method of manufacturing the vertical MOSFET according to the second embodiment of the present invention, which is a graph representative of the insulation breakdown voltage of the gate oxide film.

Accordingly, the gate insulation breakdown voltage of the conventional vertical MOSFET was nearly 20 V, whereas the gate insulation withstand voltage of the vertical MOSFET according to this embodiment exceeded 40 V (see FIG. 8). It is noted that FIG. 8 shows a relation of a maximum voltage which is applicable between the gate and the source and its number (frequency) when the thickness of the gate oxide film is set to 500 angstrom. The applicable maximum voltage is defined by a voltage between the gate and the source when a current $I_{GS}$ flowing between the gate and the source is 10 μA.

The following advantages can be obtained by using the present invention structure as described above.

With the formation of the selective oxide film at a temperature ranging from 1100 to 1200° C., no curved portion is formed on the main portion of the side wall of the U-groove. Further, the source region formed in contact with the side wall of the second groove can be made shallow, thereby reducing the parasitic capacitance of the vertical MOSFET. Finally, with no curved portion on the main portion of the side wall of the U-groove, the gate oxide film formed on the inner wall of the U-groove becomes uniform in thickness and the insulation breakdown voltage of the gate oxide film is prevented from being deteriorated.

It is apparent that the present invention from the aforementioned discussion is not limited to the above embodiments but may be modified and changed without departing from the scope and spirit of the present invention.

What is claimed is:

1. A method of manufacturing a semiconductor device, comprising the steps of:

forming a groove in said semiconductor wafer;

performing local oxidation of silicon (LOCOS) to form a LOCOS film on said semiconductor wafer in said groove so that a whole side surface of said semiconductor wafer exposed by said groove is essentially flat;

removing said LOCOS film in said groove;

forming a thermal insulating film on said semiconductor wafer in said groove; and forming a conductive film on said thermal insulating film.

2. The method as claimed in claim 1, wherein said LOCOS is performed at a temperature of 1100° C. or higher.

3. The method as claimed in claim 2, wherein said LOCOS is performed at a temperature ranging from 1100 to 1200° C.

4. The method as claimed in claim 3, wherein said groove is formed by an ion reactive etching.

5. The method as claimed in claim 1, further comprising steps of:

introducing a first impurities into said semiconductor wafer using said LOCOS film as a mask to form a base region; and introducing a second impurities into said semiconductor wafer using said LOCOS film as a mask to form a source region.

6. The method as claimed in claim 5, wherein said base region has a channel portion produced when said conductive film is activated and a crystal face of said channel portion being (100).

7. The method as claimed in claim 1, wherein said semiconductor wafer includes a source region, a base region, and a semiconductor substrate, and before said groove is formed, said base region is formed over said semiconductor substrate and said source region is formed on said base region.

8. The method as claimed in claim 7, wherein said base region has a channel portion produced when said conductive film is activated, and a crystal face of said channel portion being (100).

9. A method of manufacturing a vertical MOSFET, comprising the step of:

performing local oxidation of silicon (LOCOS) at a temperature of 1100° C. or greater to form an essentially flat vertical wall on a source region of said vertical MOSFET.

10. The method as claimed in claim 9, wherein said LOCOS is performed at a temperature ranging from 1100 to 1200° C.

11. The method as claimed in claim 10, wherein a groove is formed by an ion reactive etching.

12. The method as claimed in claim 11, wherein a crystal face of a channel of said MOSFET is (100).

* * * * *